United States Patent [19]

Kohn

[11] Patent Number: 4,499,651
[45] Date of Patent: Feb. 19, 1985

[54] METHOD OF MANUFACTURING A FIELD-EFFECT TRANSISTOR

[75] Inventor: Erhard Kohn, Leingarten, Fed. Rep. of Germany

[73] Assignee: Telefunken Electronic GmbH, Heilbronn, Fed. Rep. of Germany

[21] Appl. No.: 521,938

[22] Filed: Aug. 10, 1983

[30] Foreign Application Priority Data

Aug. 20, 1982 [DE] Fed. Rep. of Germany ....... 3230945

[51] Int. Cl.³ .................... H01L 21/467; H01L 29/76
[52] U.S. Cl. ........................................ 29/571; 29/590; 148/1.5; 357/22
[58] Field of Search ................... 148/1.5, 175; 29/571, 29/590, 591; 357/22, 55, 67; 204/56 R

[56] References Cited

U.S. PATENT DOCUMENTS

| 4,102,714 | 7/1978 | DeBar et al. | 357/55 |
| 4,105,475 | 8/1978 | Jenne | 148/175 |
| 4,116,720 | 9/1978 | Vinsow | 148/1.5 |
| 4,157,610 | 6/1979 | Kamei et al. | 204/56 R |

FOREIGN PATENT DOCUMENTS 57-207349 12/1982 Japan ..................... 148/1.5

OTHER PUBLICATIONS

Kohn, "V-Shaped Gate GaAs MESFET for Improved High Frequency Performance", *Electronics Letters*, vol. 11, No. 8, Apr. 1975.

Primary Examiner—Brian E. Hearn
Assistant Examiner—Hunter L. Auyang
Attorney, Agent, or Firm—Spencer & Frank

[57] ABSTRACT

In a method for the manufacture of a field-effect transistor comprising a substrate and an epitaxial layer located thereon, a V-shaped trench extending from the surface of the epitaxial layer through the epitaxial layer into the substrate is made and a zone is created by implantation in an area located in front of the V-shaped trench.

20 Claims, 7 Drawing Figures

METHOD OF MANUFACTURING A FIELD-EFFECT TRANSISTOR

BACKGROUND OF THE INVENTION

High-speed FETs are known to require a short channel running time or transit frequency. Short channel running times can only be obtained by using extremely short channel lengths in the sub-$\mu$m-range ($<0.5$ $\mu$m) and very high electron drift speeds ($>2.10^7$ cm/sec). It is therefore most important for high-speed field-effect transistors to have short channel lengths.

SUMMARY OF THE INVENTION

It is an object of the invention to provide a method for the manufacture of a field-effect transistor which enables easy manufacture of field-effect transistors having a short channel.

According to the invention, there is produced in a method for manufacturing a field-effect transistor comprising a substrate and an epitaxial layer located thereon, a V-shaped trench extending from the surface of the epitaxial layer through the epitaxial layer into the substrate, with a zone being created by implantation in an area located in front of the V-shaped trench.

BRIEF DESCRIPTION OF THE DRAWINGS

The invention will now be described in greater detail, by way of example, with reference to the drawings, in which.

DESCRIPTION OF THE PREFERRED EMBODIMENT

Figure 1:
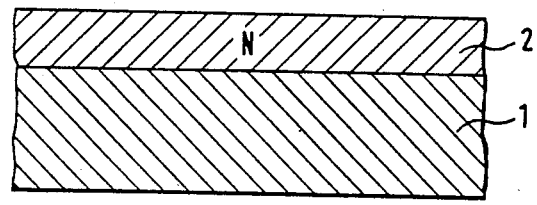
FIG. 1 shows a base member including a substrate with an epitaxial layer.
Figure 2:
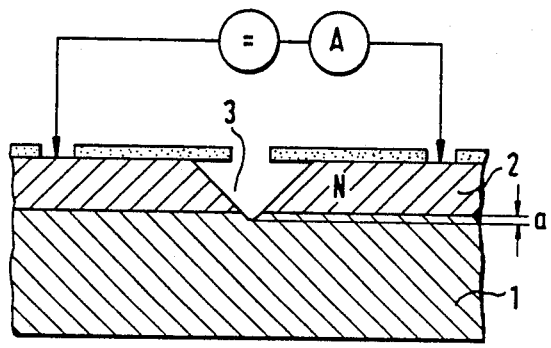
FIG. 2 shows the V-shaped trench in the epitaxial layer.

In the manufacture of a field-effect transistor according to the invention, one proceeds, for example, from a semi-insulating substrate 1 as shown in FIG. 1, and deposits an epitaxial layer 2 of the n-conductance-type on this substrate. A V-shaped trench 3 is etched into the epitaxial layer 2 as shown in FIG. 2. A photoresist layer serves as etching mask. The trench depth can be controlled by measurement of the current in the epitaxial layer, 2. That is, when the channel current measured reaches zero, this is an indication that the epitaxial layer 2 has just been etched through and the bottom of trench 3 has reached the substrate 1. In the field-effect transistor according to the invention, however, the V-shaped trench 3 should not only extend as far as the substrate 1, but to a certain extent also into the substrate 1. By means of slow-acting etching solutions (e.g. citric acid+$H_2O_2$+$H_2O$) the depth a (depth of penetration of trench 3 into the substrate 1) can be easily set at, e.g., 0.1 $\mu$m. Fluctuations in this penetration depth do not, however, extend into the thickness of the active channel area which has still to be created. The angle of inclination formed by the walls of the etching trench 3 may be set by suitable crystal orientation and choice of etching solution. In the embodiment, the angle formed by the two trench walls is, for example, 50° to 55°.

Figure 3:
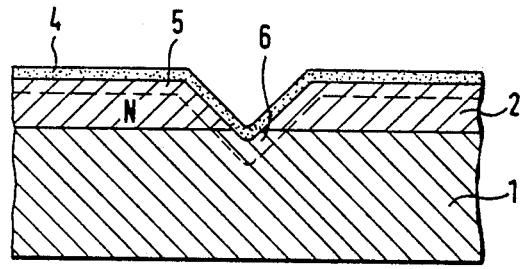
FIG. 3 shows the passivation layer on the epitaxial layer and the implanted channel.

After the etching trench 3 has been made, the implanted channel is formed. First of all, however, the photoresist layer is removed from the surface of the epitaxial layer 2, the surface is then cleaned and a passivation layer 4 is applied to the cleaned surface of the epitaxial layer 2, as shown in FIG. 3. The passivation layer may, for example, consist of $Si_3N_4$. Following this, a zone 5 of the same conductivity type as the epitaxial layer 2 is implanted into the entire surface by the implantation process. After reinforcement of the passivation (or renewed passivation), the implanted zone 5 is annealed at high temperatures (around 800° C.) and the implanted zone is activated.

The implantation and activation result in the formation in the substrate 1 of an implanted channel 6 whose depth (and pinch-off-voltage) is determined exclusively by the implanted profile. The channel length is determined by the channel depth a and will be approximately 0.3 $\mu$m$\pm$0.15 $\mu$m at a=0.1 $\mu$m$\pm$0.05 $\mu$m.

Figure 4:
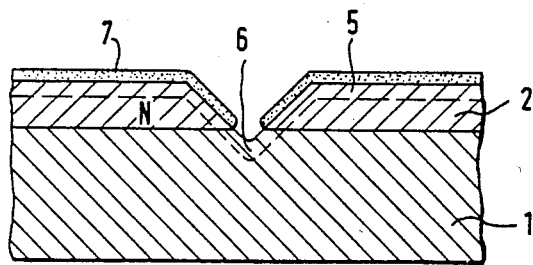
FIG. 4 shows a selective oxide layer on the surface after removal of the passivation layer.

Following the creation of the implanted channel 6, the passivation layer 4 is removed and the entire surface is oxidized in an electrolyte in the dark. As is apparent from FIG. 4, oxide 7 will grow in certain areas only since the anodic oxidation process requires open holes. In the instant invention, the voltage applied must be greater than the break-down voltage of the diode formed by the epitaxial layer 2 and the electrolyte. If this is the case, an oxide will readily start to grow on the N+ area 2 (epitaxial layer) when a correspondingly low voltage is applied, whereas the surface area of the active channel area 6 remains free of oxide. The thickness of the selective oxide layer 7 depends on the break-down voltage of the electrolyte-diode which corresponds to that of a Schottky diode. With a channel doping of from 1 to $2\times10^{17}$ cm$^{-3}$, the thickness of the oxide layer is, for example, 200 to 300 Å, corresponding to a break-down voltage of 10 to 15 volts.

Figure 5:
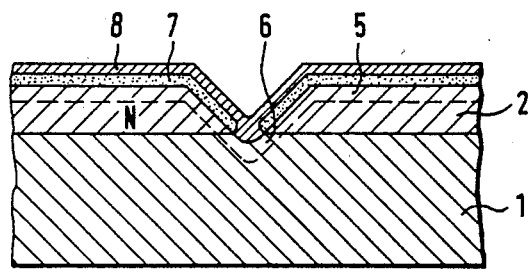
FIG. 5 shows a metal layer on the oxide layer.
Figure 6:
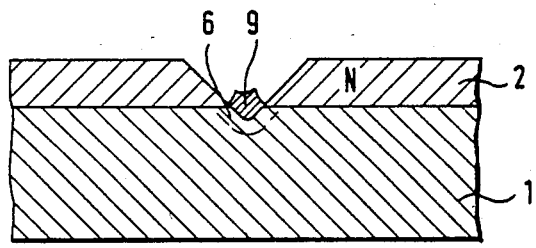
FIG. 6 shows the electrode which is made from the metal layer.
Figure 7:
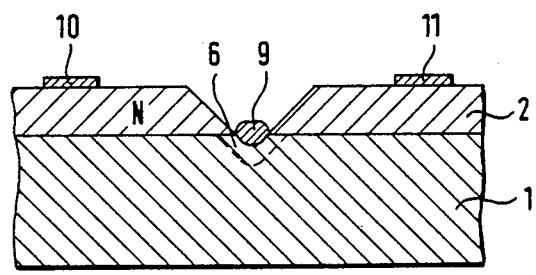
FIG. 7 shows the finished field-effect transistor.

Following the formation of the oxide layer 7, a metal layer 8 is vapor-deposited over the entire surface as shown in FIG. 5. The metal layer consists of the material of the gate electrode. Suitable materials for the layer 8 are, for example, TiAu, MoAu or TaMo. After the metal layer 8 is vapor-deposited, the section of this metal layer which is located on the oxide layer 7 is removed together with the oxide layer 7. This can be done, for example, by means of stripping. Following the stripping, which may, for instance, be carried out in HCl, there remains of the metal layer 7 only the gate electrode 9, as shown in FIG. 6. FIG. 7 shows the finished field-effect transistor which comprises in addition to the gate electrode, the source electrode 10 and the drain electrode 11.

What is claimed is:

1. A method of manufacturing a field-effect transistor comprising a substrate and an epitaxial layer thereon, wherein a V-shaped trench which extends from the surface of the epitaxial layer into the substrate is created, and a zone is formed by means of implantation in at least the area of the substrate located in front of and bordering the V-shaped trench.

2. A method according to claim 1, wherein the substrate consists of a semi-insulating material or a semiconductor material of the opposite conductivity type than the epitaxial layer.

3. A method according to claim 1, wherein the implanted zone is of the same conductivity type as the epitaxial layer.

4. A method according to claim 1, wherein the V-shape of the trench and the thickness of the implanted zone are chosen so as to obtain a certain channel length in the substrate.

5. A method according to claim 1, wherein a passivation layer is produced on the epitaxial layer prior to the implantation.

6. A method according to claim 5, wherein the implanted zone is activated by annealing after the passivation layer is produced.

7. A method according to claim 6, wherein the annealing is carried out at a temperature in the range of 800° C.

8. A method according to claim 6, wherein the passivation layer is reinforced or subjected to passivation again prior to the annealing.

9. A method according to claim 6, wherein the passivation layer is removed following the annealing and activating of the implanted zone.

10. A method according to claim 9, wherein after the removal of the passivation layer, a second passivation layer is formed which covers the wall of the V-shaped trench with the exception of the portion of the trench wall located in the substrate.

11. A method according to claim 10, wherein the second passivation layer is an oxide layer formed by oxidation in an electrolyte.

12. A method according to claim 11, wherein the oxidation is carried out in the dark.

13. A method according to claim 11, wherein the voltage applied during oxidation is selected so as to be higher than the break-down voltage of the diode formed by the epitaxial layer and the electrolyte.

14. A method according to claim 11, wherein the voltage applied during oxidation is so selected that an oxide layer is formed only on the epitaxial layer.

15. A method according to claim 10, wherein a metal for a gate electrode is applied after formation of the second passivation layer.

16. A method according to claim 15, wherein TiAu, MoAu or TaMo is used as the metal for the gate electrode.

17. A method according to claim 15, wherein the gate electrode is vapor-deposited.

18. A method according to claim 17, wherein the metal for the gate electrode is vapor-deposited over the entire surface of the second passivation layer and of the portion of the trench wall in the substrate, and the section of the vapor-deposited metal layer which is not intended for the gate electrode is removed together with the oxide layer underneath it.

19. A method of manufacturing a field effect transistor comprising:
   providing a substrate having an epitaxial layer of one conductivity type on one surface of the substrate and with the substrate consisting of a semi-insulating material or a semiconductor material of the opposite conductivity type than that of the epitaxial layer;
   creating a V-shaped trench which extends from the surface of the epitaxial layer into the substrate, and divides the epitaxial layer into two separate portions;
   by means of implantation, forming a zone of the same conductivity type as the epitaxial layer in at least the area of the substrate bordering the trench so as to provide a channel region for the transistor;
   applying a gate electrode to the surface of the portion of the trench in the substrate so as to contact the zone formed therein; and
   applying respective source and drain electrodes to the separate portions of the epitaxial layer.

20. The method defined in claim 19 wherein said step of applying a gate electrode includes:
   forming an oxide layer which covers the walls of the trench other than the portion of the trench walls in the substrate by anodic oxidation in an electrolyte;
   depositing a metal over the entire surface of the walls of the trench including the portion having the oxide layer thereon; and
   removing the oxide layer and the overlying deposited metal.

* * * * *